United States Patent [19]

Chu et al.

[11] 4,076,555

[45] Feb. 28, 1978

[54] IRRADIATION FOR RAPID TURN-OFF REVERSE BLOCKING DIODE THYRISTOR

[75] Inventors: Chang K. Chu; John Bartko, both of Pittsburgh; Patrick E. Felice, Jeannette, all of Pa.

[73] Assignee: Westinghouse Electric Corporation, Pittsburgh, Pa.

[21] Appl. No.: 686,857

[22] Filed: May 17, 1976

[51] Int. Cl.² ........................................ H01L 21/263
[52] U.S. Cl. .................................. 148/1.5; 148/33.5; 148/187
[58] Field of Search .................... 148/1.5, 33.5, 187

[56] References Cited

U.S. PATENT DOCUMENTS

| 3,809,582 | 5/1974 | Tarneja et al. | 148/1.5 |
| 3,881,963 | 5/1975 | Chu et al. | 148/1.5 |
| 3,881,964 | 5/1975 | Cresswell et al. | 148/1.5 |

Primary Examiner—G. Ozaki
Attorney, Agent, or Firm—C. L. Menzemer

[57] ABSTRACT

The turn-off time of a reverse blocking diode thyristor is decreased without significantly effecting other electrical characteristics by irradiating with a radiation source to a dosage corresponding to between about $4 \times 10^{13}$ and about $2 \times 10^{14}$ electrons/cm² and preferably to between about $6 \times 10^{13}$ and about $2 \times 10^{14}$ electrons/cm² with 2 MeV electron radiation source. Preferably the radiation source is electron radiation with an energy greater than 1 MeV.

5 Claims, 2 Drawing Figures

IRRADIATION FOR RAPID TURN-OFF REVERSE BLOCKING DIODE THYRISTOR

FIELD OF THE INVENTION

The present invention relates the manufacture of semiconductor devices, and particularly fast turn-off reverse blocking diode thyristors.

BACKGROUND OF THE INVENTION

A reverse blocking diode thyristor (RBDT) is a two terminal thyristor with shorts to the cathode-base region. The device is capable of being switched from a high impedance "off" state to a low impedance "on" state in a very short period of time. The reverse blocking diode thyristor is fully described by Chu, C. K. et al in IEEE, Industry Application Society pp. 267-82 (1973).

Reverse blocking diode thyristors are utilized in very fast switching applications such as radar modulators and laser pulse generators. The device is capable of operating at a peak current in excess of 800 amps and switching from the high-impedance, "off" state to the low-impedance, "on" state at a current turn-on rate (di/dt) of greater than 2000 amps per microsecond. The repetition rate is in excess of 1000 PPS.

Reverse blocking diode thyristors have, however, been limited by their slow turn-off time. That is, the time period before which the blocking state can be reestablished on reduction of the current below the holding current of the thyristor. The turn-off time is directly related to the lifetime of the minority carriers in the high resistivity anode-base region of the thyristor. The turn-off time of reverse blocking diode thyristors are, therefore, generally about 200 microseconds, which is too high for high frequency applications where RBDTs would otherwise be advantageous.

The present invention is an improvement on a method described and claimed in U.S. Pat. No. 3,881,963, granted May 6, 1975 to the applicants and assignee of this application. Companion patents and patent applications are U.S. Pat. Nos. 3,809,582, 3,840,887, 3,852,612, 3,872,493, 3,877,977, 3,881,964, 3,888,701, and 3,933,527 and U.S. patent application Ser. Nos. 540,208 (filed Jan. 10, 1975) now Pat. No. 3,990,091, 581,255 (filed May 27, 1975), 639,337 (filed Dec. 10, 1975) and 667,791 (filed Mar. 17, 1976), all of which are assigned to the same assignee as the present application.

In U.S. Pat. No. 3,881,963, applicants teach the radiation of thyristors with radiation sources generally and electron radiation sources preferably to decrease the turn-off time. The radiation dosage level prescribed corresponds to less than $2 \times 10^{14}$ and preferably less than $8 \times 10^{13}$ electrons/cm$^2$ with 2 MeV electron radiation. More desirably, the radiation dosage level corresponds to greater than $1 \times 10^{13}$ and preferably greater than $3 \times 10^{13}$ electrons/cm$^2$ with 2 MeV electron radiation. Although the irradiation may be performed with gamma and other kinds of radiation as described, it is preferred that electron radiation of any energy greater than 1 MeV be used for the radiation source.

Applicants have now found that the turn-off time of reverse blocking diode thyristors can be particularly improved by utilization of a specified narrower range of radiation dosage.

SUMMARY OF THE INVENTION

The present invention provides a reverse blocking diode thyristor semiconductor body in which the turn-off time is decreased without significantly effecting forward voltage drop and other electrical characteristics of the device. The reverse blocking diode thyristor body is disposed with one major surface thereof preferably adjoining the cathode-emitter region exposed to a radiation source and thereafter the device is irradiated with said radiation source to a dosage corresponding to between about $4 \times 10^{13}$ and about $2 \times 10^{14}$ electrons/cm$^2$, and preferably to between about $6 \times 10^{13}$ and about $2 \times 10^{14}$ electrons/cm$^2$ with 2 MeV electron radiation.

Electron radiation is preferably used as the radiation source because of availability and inexpensiveness. It is anticipated, however, that any kind of irradiation may be appropriate provided it is capable of disrupting the atomic lattice to create energy levels substantially decreasing minority carrier lifetimes without correspondingly increasing the carrier regeneration rate. Electron radiation is also preferred over gamma radiation because of its availability to provide adequate dosages in a commercially practical time.

Further, it is preferred that the energy of the electron radiation be greater than 1 MeV. Lower level radiation is generally believed to result in substantial elastic collisions with the atomic lattice and, therefore, does not provide enough damage to the lattice in a commercially practical time.

To provide appropriate radiation, it has been found that the radiation dosages above about $4 \times 10^{13}$ electrons/cm$^2$ and preferably above about $6 \times 10^{13}$ electrons/cm$^2$ are needed. Lower dosage levels have not been found to effect significant reduction in the turn-off times. Conversely, it has been found that the radiation dosages must not exceed about $2 \times 10^{14}$ electrons/cm$^2$ so that the forward voltage drop of the reverse blocking diode thyristor can be maintained within specifications.

Other details, objects and advantages of the invention will become apparent as the following description of the presently preferred embodiments and presently preferred methods of practicing the same proceeds.

BRIEF DESCRIPTION OF THE DRAWINGS

The accompanying drawings, the presently preferred embodiments of the invention and presently preferred methods of practicing the invention are illustrated, in which.

DESCRIPTION OF THE PREFERRED EMBODIMENTS

Figure 1:
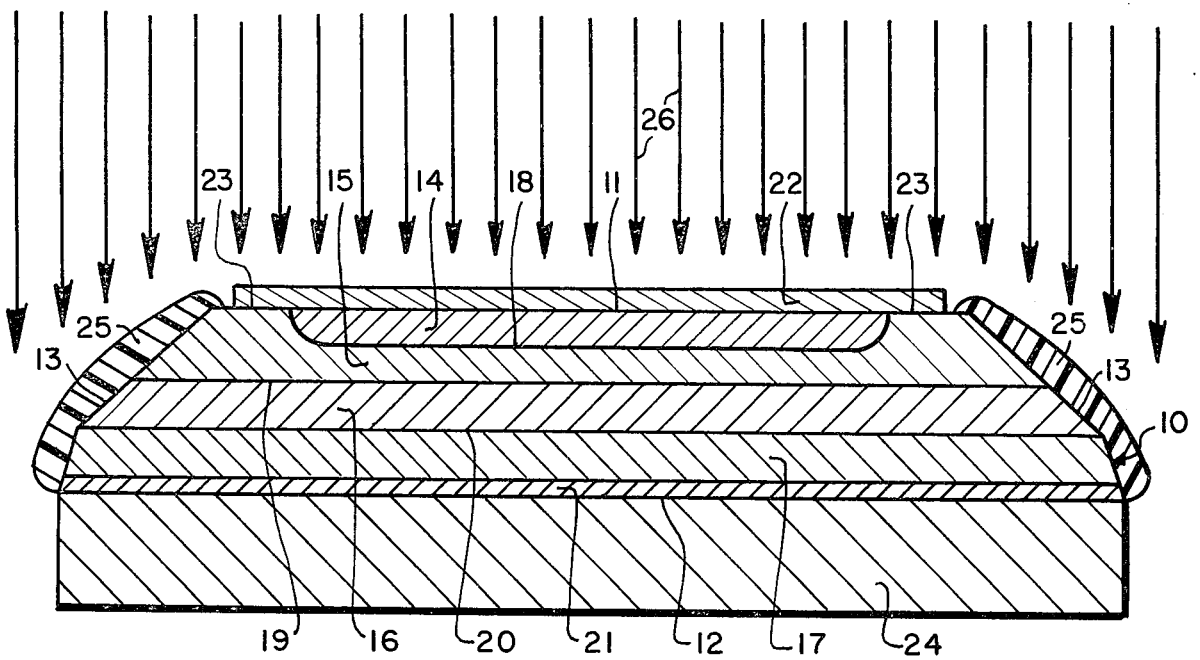
FIG. 1 is an elevational view in cross-section of a reverse blocking diode thyristor being irradiated in accordance with the invention.

Referring to FIG. 1, a reverse blocking diode thyristor is shown being irradiated in accordance with the present invention. The reverse blocking diode thyristor is disposed in semiconductor body 10 having opposed major surfaces 11 and 12 and side surfaces 13. The semiconductor body is typically N-type float-zone silicon having a resistivity between 15 and 70 ohm-cm and a thickness between 10 and 30 mils.

The thyristor is comprised of cathode-emitter region 14 and anode-emitter region 17 of impurities of opposite conductivity type adjoining major surfaces 11 and 12, respectively. The thyristor also has cathode-base region 15 and anode-base region 16 of impurities of opposite conductivity type in the interior of body 10 between emitter regions 14 and 17. Cathode-emitter region 14 and cathode-base region 15, as well as anode-base region 16 and anode-emitter region 17 are also of opposite conductivity type. By this arrangement, the thyristor is provided with a four-layer impurity structure in which three PN junctions 18, 19 and 20 are formed at the transitions between regions of opposite type conductivity.

Cathode-base and anode-emitter regions 15 and 17 are preferably simultaneously formed by selective diffusion of, for example, boron, gallium or aluminum through major surfaces 11 and 12 by standard diffusion techniques. However, anode-emitter region 17 may be made thicker than cathode-base region 15 by delayed diffusion of the anode-emitter region or subsequent etching of major surface 11. The resulting diffusion of cathode-base region 15 is typically with a surface impurity concentration between $6 \times 10^{16}$ and $1 \times 10^{18}$ atoms/cm$^3$ and a thickness between 40 and 70 microns. Anode-emitter region 17 is also preferably formed with a surface impurity concentration between $6 \times 10^{16}$ and $1 \times 10^{18}$ atoms/cm$^3$ and a thickness between 30 and 70 microns. The anode-base region 16 was thus also formed between regions 15 and 16 with a uniform impurity concentration throughout of between $3.5 \times 10^{14}$ and $9 \times 10^{13}$ atoms/cm$^3$ and a thickness between about 100 and 200 microns. Cathode-emitter region 14 is thereafter formed preferably by selective diffusion of, for example, phosphorus through major surface 11, typically to a surface impurity concentration of between $1 \times 10^{20}$ and $5 \times 10^{20}$ atoms/cm$^3$ and a thickness of between 5 and 25 microns.

The thickness and impurity concentration of anode-base region 16 generally characterizes the operation of the reverse blocking diode thyristor. Generally, the device is switched by a high voltage pulse which punches-through the anode-base region, causing a current gain multiplication factor. The device may also be switched by application of a simple high voltage applied across the thyristor which causes avalanche of blocking junction 19. In either switching mode switching is controlled by the thickness and resistivity of anode-base region 16 which primarily supports the depletion region at blocking junction 19.

The thickness and resistivity of anode-base region 16 is generally selected to avoid avalanche, yet insure punch-through on application of a specified voltage pulse. These electrical characteristics are typically provided by selecting a low current gain for the PNP transistor equivalent, with the anode-base region 16 as base, and a high current gain for the NPN transistor equivalent, with cathode-base region 15 as base. However, this choice of parameters increases the injection efficiency of carriers into the anode-base region 16 and causes premature switching at operating temperature (i.e. 125° C).

A high impurity surface portion 21 of anode-emitter region 17 of an impurity of the same conductivity type as anode-emitter region 17 is also selectively diffused through major surface 12 to control the thickness of anode-emitter region 17 and provide good ohmic contact to anode-emitter region 17. Region 21 is typically of a surface impurity concentration between $5 \times 10^{18}$ and $5 \times 10^{20}$ atoms/cm$^3$ and a thickness between 10 and 20 microns.

To provide electrical connections to the thyristor, metal contact 22 makes common ohmic contact at major surface 11 to cathode-base region 15 and cathode-emitter region 14, and supporting metal electrode 24 makes ohmic contact at major surface 12 to anode-emitter region 17. Metal contact 22 is preferably formed by selective metallization of a suitable metal, such as aluminum, molybdenum, gold, silver, tantalum and base alloy thereof, to a thickness typically of 40,000 Angstrons, or alternatively, by indiscriminate metallization of such a suitable metal followed by selective removal of portions of the deposited metal by standard photolithographic and etch techniques. Contact thus makes contact to cathode-base region 15 around the entire periphery of cathode-emitter region 14 at 23. Electrode 24 is preferably formed by alloying a metal substrate of typically 80 mils in thickness such as molybdenum to major surface 12. To reduce channeling and atmospheric effects on the thyristor operation, side surfaces 13 are beveled, etched and coated with a suitable passivating resin 25 such as silicone, epoxy or varnish composition.

Irradiation is performed on the reverse blocking diode thyristor in accordance with the present invention by positioning major surface 11 of body 10 for exposure to a suitable radiation source such as a Van de Graaff accelerator, as shown in FIG. 1. The thyristor is thereafter irradiated to a dosage corresponding to between about $4 \times 10^{13}$ and $2 \times 10^{14}$ electrons/cm$^2$ with 2 MeV electron radiation and preferably to between $6 \times 10^{13}$ and $2 \times 10^{14}$ electrons/cm$^2$ with 2 MeV electron radiation.

The radiation source used for these irradiations is preferably electron radiation because of the availability and inexpensiveness. Moreover, electron radiation (or gamma radiation) may be preferred in applications where the damage desired to the semiconductor lattice is to single atoms and small groups of atoms. This is in contrast to neutron, proton and alpha radiation which causes more localized, but larger scale disorders of as many as a few hundred atoms in the semiconductor crystal. The latter type of radiation source may, however, be preferred in certain applications because of its better defined range and better controlled depth of lattice damage. It is anticipated that any kind of irradiation may be appropriate provided it is capable of disrupting the atomic lattice to create energy levels substantially decreasing minority carrier lifetime and not correspondingly increasing the carrier regeneration rate.

Electron radiation is also preferred over gamma radiation because of its availability or provide adequate dosages in a commercially practical time. For example, a $1 \times 10^{14}$ electrons/cm$^2$ dosage at 2 MeV electron radiation will result in approximately the same lattice damage as that produced by $1 \times 10^8$ rads dosage of gamma radiation. Such dosages of gamma radiation, however, would entail an hour or more and usually several weeks of irradiation, while such dosages can be supplied by electron radiation in minutes.

Further, it is preferred that the energy of the electron irradiation be greater than 1 MeV and most desirably of 2 MeV or greater. Lower level radiation is generally believed to result in substantial elastic collisions with the atomic lattice, and, therefore, does not provide enough damage to the lattice in commercially feasible time.

The optimum dosage within the prescribed range is selected empirically. This precise dosage will vary the type of the thyristor, the kind of radiation, the energy of the radiation, and the incremental change in turn-off time that is desired.

Figure 2:
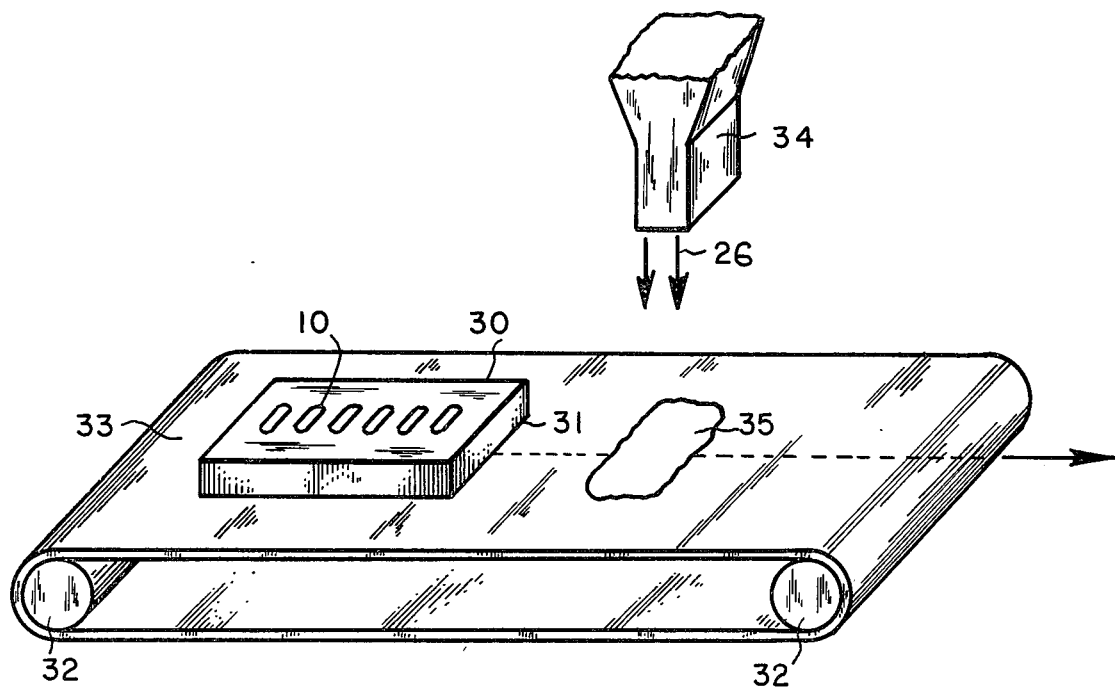
FIG. 2 is a perspective of apparatus for performance of irradiation on a series of reverse blocking diode thyristors as shown in FIG. 1.

Referring to FIG. 2, apparatus is shown for performing irradiation on the reverse blocking diode thyristor semiconductor body 10 as shown in FIG. 1 with electron radiation. A conveyor belt 33 is moved along roller or pulley means 32, which is rotated by a suitable power means (not shown). A 2 MeV Van de Graaff accelerator 34 is positioned to direct electron radiation 26 essentially perpendicular to conveyor belt 33 to strike it at 35. A series of reverse blocking diode thyristor bodies 10 are positioned in planar array on a water-cooled tray 30 having electrostatically attractive periphery 31. Bodies 10 are positioned with major surfaces 11 adjoining cathode-emitter region 14 facing upwardly as shown in FIG. 1. To perform irradiation, the electron dosage rate is measured by use of a Faraday Cup in conjunction with an Alcon charge integrator, and the radiation level adjusted to desired dosage. Tray 30 with bodies 10 in place thereon is then placed on the conveyor belt 33 and moved by the conveyor belt in the direction of the arrow through the electron radiation 26. The radiation dosage can also be controlled by the speed of conveyor belt 33 as well as the energy level of the electron radiation.

By the irradiation as shown in FIGS. 1 and 2, the turn-off time of the reverse blocking diode thyristor body is typically reduced from about 200 to 250 microseconds to about 20 to 60 microseconds, while maintaining other electrical characteristics and particularly the forward voltage drop of the reverse blocking diode thyristor within specified values.

To illustrate the operation of the invention, the electrical characteristics of 20 reverse blocking diode thyristors were measured after irradiation to various given dosages.

The reverse blocking diode thyristors used in these tests were fabricated with 28–44 ohm-cm N-type float zone silicon wafers each of about 10 mils in thickness and 0.375 inch in diameter. The thyristor had a cathode-emitter region of 0.230 inch in diameter. In the thyristor the cathode-emitter region is an N-type surface impurity concentration diffusion of about $3 \times 10^{20}$ atoms/cm$^3$ and a thickness of about 12 microns; the cathode-base region is a P-type surface impurity concentration diffusion of about $1 \times 10^{17}$ atoms/cm$^3$ and a thickness of about 20 microns; the anode-emitter region is a P-type surface impurity concentration diffusion of about $1 \times 10^{17}$ atoms/cm$^3$ and a thickness of about 40 microns; and the anode-base region has a N-type impurity concentration of between about 1.2 and $1.5 \times 10^{14}$ atoms/cm$^3$ throughout (corresponding to the resistivity of the original wafer) and a thickness of about 150 microns. The high impurity portion 21 of anode-base region 17 adjoining contact 24 had a surface impurity concentration of $1 \times 10^{19}$ atoms/cm$^3$ and a thickness of 10 microns.

Nominally, the reverse blocking diode thyristor before irradiation had a reverse breakover voltage of 1200 volts at 25° C, a turn-on pulse voltage of 5000 volts per microsecond at 25° C, a turn-on time of 100 nanoseconds at 25° C; a forward voltage drop of 4 volts at 1000 amps, and a turn-off of about 200 to 250 microseconds.

The reverse blocking diode thyristor was irradiate with 2 MeV electron radiation to selected dosages between $3.9 \times 10^{12}$ and $1 \times 10^{14}$ electrons/cm$^2$. Control was maintained by concurrently measuring the electrical characteristics of 5 reverse blocking diode thyristors which were not irradiated.

A tabulation of the measurements of the electrical characteristics is shown in the Table.

TABLE

| Unit No. | $V_{RS}$ volts at 25° C | $I_{RS}$ ma at 25° C | radiation dosage e/cm$^2$ at 2MeV | dV/dt at $V_{FD}$ V/$\mu$ at 125° C | turn off $I_F\mu s$ 350 at 125° C | di/dt (a/$\mu$s) at 800A Peak | $V_F$ at $I_F$ 1000A |
|---|---|---|---|---|---|---|---|
| 1 | 900 | 5 | none | 5 | 175 | 2200 | 3.7 |
| 2 | 1000 | 10 | none | 40 | 210 | 2300 | 3.7 |
| 3 | 900 | 18 | none | 50 | 270 | 2400 | 3.9 |
| 4 | 900 | 10 | none | 25 | 275 | 2500 | 4.0 |
| 5 | 100 | 25 | none | 35 | 180 | 2300 | 3.8 |
| 6 | 700 | 12 | $3.9 \times 10^{12}$ | 30 | 170 | 2300 | 3.7 |
| 7 | 1100 | 2 | $3.9 \times 10^{12}$ | — | — | 2300 | 3.8 |
| 8 | 1200 | 25 | $3.9 \times 10^{12}$ | 800 | 90 | 2300 | 3.7 |
| 9 | 850 | 12 | $3.9 \times 10^{12}$ | 25 | 170 | 2300 | 3.5 |
| 10 | 1100 | 15 | $3.9 \times 10^{12}$ | — | — | 2200 | 4.0 |
| 11 | 820 | 5 | $4 \times 10^{13}$ | — | — | — | — |
| 12 | 600 | 12 | $4 \times 10^{13}$ | 20 | 68 | 2200 | 3.9 |
| 13 | 1120 | 40 | $4 \times 10^{13}$ | 800 | 40 | 2300 | 4.0 |
| 14 | 1200 | 20 | $4 \times 10^{13}$ | 140 | 52 | 2300 | 4.8 |
| 15 | 1000 | 10 | $4 \times 10^{13}$ | 600 | 55 | 2200 | 4.0 |
| 16 | 1120 | 17 | $6 \times 10^{13}$ | 600 | 40 | 2100 | 4.7 |
| 17 | 1260 | 9 | $6 \times 10^{13}$ | 800 | 50 | 2200 | 5.0 |
| 18 | 1250 | 23 | $6 \times 10^{13}$ | 400 | 44 | 2200 | 4.8 |
| 19 | 1000 | 4 | $6 \times 10^{13}$ | 500 | 38 | 2100 | 5.1 |
| 20 | 1000 | 14 | $6 \times 10^{13}$ | 300 | 62 | 2200 | 4.9 |
| 21 | 1100 | 30 | $1 \times 10^{14}$ | 800 | 28 | shorted | 6.6 |
| 22 | 700 | 30 | $1 \times 10^{14}$ | 800 | 23 | 2600 | 5.0 |
| 23 | 1000 | 10 | $1 \times 10^{14}$ | 600 | 28 | 2200 | 5.3 |
| 24 | 1200 | 80 | $1 \times 10^{14}$ | 800 | 24 | 2200 | 6.2 |
| 25 | 950 | 25 | $1 \times 10^{14}$ | 800 | 18 | shorted | 6.1 |

As shown in the Table, the turn-off time of the reverse blocking diode thyristors was greatly reduced with irradiation dosages about $4 \times 10^{13}$ electrons/cm$^2$ and most desirably about $6 \times 10^{13}$ electrons/cm$^2$. Generally, the turn-off time dropped from between about 200 and 300 microseconds to between 20 and 70 microseconds without significantly effecting the other electrical characteristics and particularly the forward voltage drop of the device. The irradiation dosage at $3.9 \times 10^{12}$ electrons/cm$^2$ did not significantly effect the turn-off time.

As an additional benefit, it was observed that premature switching at operating junction temperature (i.e. 125° C) was eliminated, especially at higher frequency (greater than 300 Hertz) operation.

While presently preferred embodiments have been shown and described, it is distinctly understood that the invention may be otherwise variously performed within the scope of the following claims. For example, the invention has been particularly described with respect to silicon semiconductor devices. It is contemplated that the present invention has utility with other semiconductor materials such as germanium and gallium arsenide, although the particular radiation and energy thereof and the effectiveness of the invention will doubtless vary with the semiconductor material.

What is claimed is:

1. A method of decreasing the turn-off time of a reverse blocking diode thyristor without significantly affecting other electrical characteristics comprising the steps of:
    A. positioning a reverse blocking diode thyristor semiconductor body with a major surface thereof to be exposed to a radiation source; and
    B. thereafter irradiating the reverse blocking diode thyristor semiconductor body with the radiation source to a dosage corresponding to between about $4 \times 10^{13}$ and $2 \times 10^{14}$ electrons/cm$^2$ with 2 MeV electron radiation.

2. A method of decreasing the turn-off time of a reverse blocking diode thyristor without significantly affecting other electrical characteristics as set forth in claim 1 wherein:
    in step B, the dosage level corresponds to greater than $6 \times 10^{13}$ electrons/cm$^2$ with 2 MeV electron radiation.

3. A method of decreasing the turn-off of a reverse blocking diode thyristor without significantly affecting the other electrical characteristics as set forth in claim 1 wherein:
    the radiation source is electron radiation.

4. A method of decreasing the turn-off time of a reverse blocking diode thyristor without significantly affecting the other electrical characteristics as set forth in claim 3 wherein:
    the electron radiation energy is greater than 1 MeV.

5. A method of decreasing a turn-off time of a reverse blocking diode thyristor without significantly affecting the other electrical characteristics as set forth in claim 4 wherein:
    in step B, the dosage level corresponds to greater than $6 \times 10^{13}$ electrons/cm$^2$.

* * * * *